United States Patent [19]

Ashuri

[11] Patent Number: 5,705,942
[45] Date of Patent: Jan. 6, 1998

[54] METHOD AND APPARATUS FOR LOCATING AND IMPROVING CRITICAL SPEED PATHS IN VLSI INTEGRATED CIRCUITS

[75] Inventor: Roni Ashuri, Zichron Yaakov, Israel

[73] Assignee: Intel Corporation, Santa Clara, Calif.

[21] Appl. No.: 537,092

[22] Filed: Sep. 29, 1995

[51] Int. Cl.$^6$ ....................................................... H03K 5/14
[52] U.S. Cl. .............................................. 326/93; 326/16
[58] Field of Search ................................. 326/93–95, 98, 326/21, 16, 101, 47; 327/262-3, 268-70, 272, 293, 295, 297; 364/490-1; 331/28, 22.1; 371/61, 62; 324/763, 765

[56] References Cited

U.S. PATENT DOCUMENTS

| | | | |
|---|---|---|---|
| 4,639,615 | 1/1987 | Lee | 327/297 |
| 4,686,455 | 8/1987 | Lassman | 371/25 |
| 4,758,745 | 7/1988 | Elgamal et al. | 326/41 |
| 4,939,389 | 7/1990 | Cox | 326/16 |
| 5,013,942 | 5/1991 | Nishimura | 327/297 |
| 5,107,153 | 4/1992 | Osaki | 307/601 |
| 5,122,679 | 6/1992 | Ishii | 327/295 |
| 5,140,184 | 8/1992 | Hamamoto | 326/93 |
| 5,206,861 | 4/1993 | Hannon | 371/28 |
| 5,414,381 | 5/1995 | Nelson | 327/295 |
| 5,430,397 | 7/1995 | Itoh et al. | 326/101 |

OTHER PUBLICATIONS

Chen, John Y.; "CMOS Devices and Technology For VLSI"; copyright 1990 (no month available) by Prentice–Hall, Inc.; pp. 101–103.

*Primary Examiner*—Edward P. Westin
*Assistant Examiner*—Benjamin D. Driscoll
*Attorney, Agent, or Firm*—Blakely, Sokoloff, Taylor & Zafman

[57] ABSTRACT

An improved local clock driver for locating critical speed paths within a integrated digital circuit. Highly integrated digital circuits have many local circuits and each local circuit has a local clock driver. The local clock driver strengthens and distributes a clock signal within the local circuit. The improved local clock driver introduces a controllable delay circuit in all the local clock drivers of the digital integrated circuit. By selectively delaying each local clock driver, critical speed paths can be located. To compensate for critical speed paths, the delay circuit can be turned on in the receiving local block circuit.

8 Claims, 4 Drawing Sheets

METHOD AND APPARATUS FOR LOCATING AND IMPROVING CRITICAL SPEED PATHS IN VLSI INTEGRATED CIRCUITS

FIELD OF THE INVENTION

The present invention is in the field of digital semiconductor electronic devices. Specifically, the present invention comprises a circuit and method for locating speed critical paths in digital semiconductor devices and improving those speed critical paths.

BACKGROUND OF THE INVENTION

Within every integrated circuit there will always be one data path between two circuit blocks that requires the longest time to generate the proper output data before the data may be sampled. This occurs due to propagation delays caused by the complex logic circuits between flip-flops. The data path that requires the longest time for the data signal to be generated before it may be sampled is known as the critical "speed path" of the integrated circuit.

The maximum speed that the digital integrated circuit may operate at is limited by the speed path in the digital integrated circuit. The reason for this is that the speed path presents the longest delay path thus the clock rate can not be increased beyond the point where the clock cycle is equal to the propagation delays in the speed path.

Since the maximum speed of an integrated circuit is limited by the speed path of the integrated circuit, it would be very desirable to easily locate the speed path in an integrated circuit. Furthermore, it would be very desirable if there were an easy way to remedy the speed path of the integrated circuit.

SUMMARY AND OBJECTS OF THE INVENTION

It is thus an object of the present invention to locate the critical speed path in an integrated circuit that limits the speed at which the integrated circuit may perform.

It is a further object of the present invention to compensate for such speed path problems.

These and other objectives are accomplished by the improved local clock driver of the present invention. Each local circuit within a very highly integrated digital circuit has a local clock driver. The local clock driver strengthens and distributes a clock signal within the local circuit. The present invention introduces a controllable delay circuit in all the local clock drivers of a digital integrated circuit. By selectively enabling the delay of each local clock circuit, critical speed paths can be located. To improve the critical speed path problems, the delay circuit can be turned on in a receiving local clock driver.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

A method and apparatus for detecting and improving critical speed path problems within digital integrated circuits is disclosed. In the following description, for purposes of explanation, specific nomenclature is set forth to provide a thorough understanding of the present invention. However, it will be apparent to one skilled in the art that these specific details are not required in order to practice the present invention. In other instances, well known circuits and devices are shown in block diagram form in order not to obscure the present invention.

Critical Speed Path

Within a digital integrated circuit, data is often shared between the various local circuits. The various local circuits are connected to each other at defined data input and output lines. For example, in FIG. 1 data line 185 carries information from local circuit 181 to local circuit 183. If the logic circuitry within local circuit 181 is sufficiently complex, a long propagation delay might be introduced before the information that will be placed on data line 185 is ready. If the speed of the clock driving the integrated circuit is increased beyond the propagation delay of the slowest data path, then the receiving local circuit 183 may sample the data on data line 185 before the transmitting local circuit in 181 has had a chance to place valid data onto data line 185. In such a situation, the receiving local circuit 183 will receive incorrect data.

Within every digital integrated circuit, there is always one path between two circuit blocks that requires the longest time to generate the proper output data before it may be sampled. The path that requires the longest time for the data signal to be generated before it may be sampled is known as the critical "speed path". The maximum speed that the digital integrated circuit may operate at is limited by the speed path in the digital integrated circuit that requires the longest delay path. To improve the performance of a digital integrated circuit, a designer must first be able to locate these speed paths.

After locating the speed path, the logic that is causing the speed path may be simplified or moved such that it no longer becomes the slowest path in the digital integrated circuit. The present invention introduces a method and circuit to locate the speed path within a digital integrated circuit. Furthermore, the present invention may also be used to compensate for the speed path within the digital integrated circuit.

Clock Signal Distribution

Figure 1:
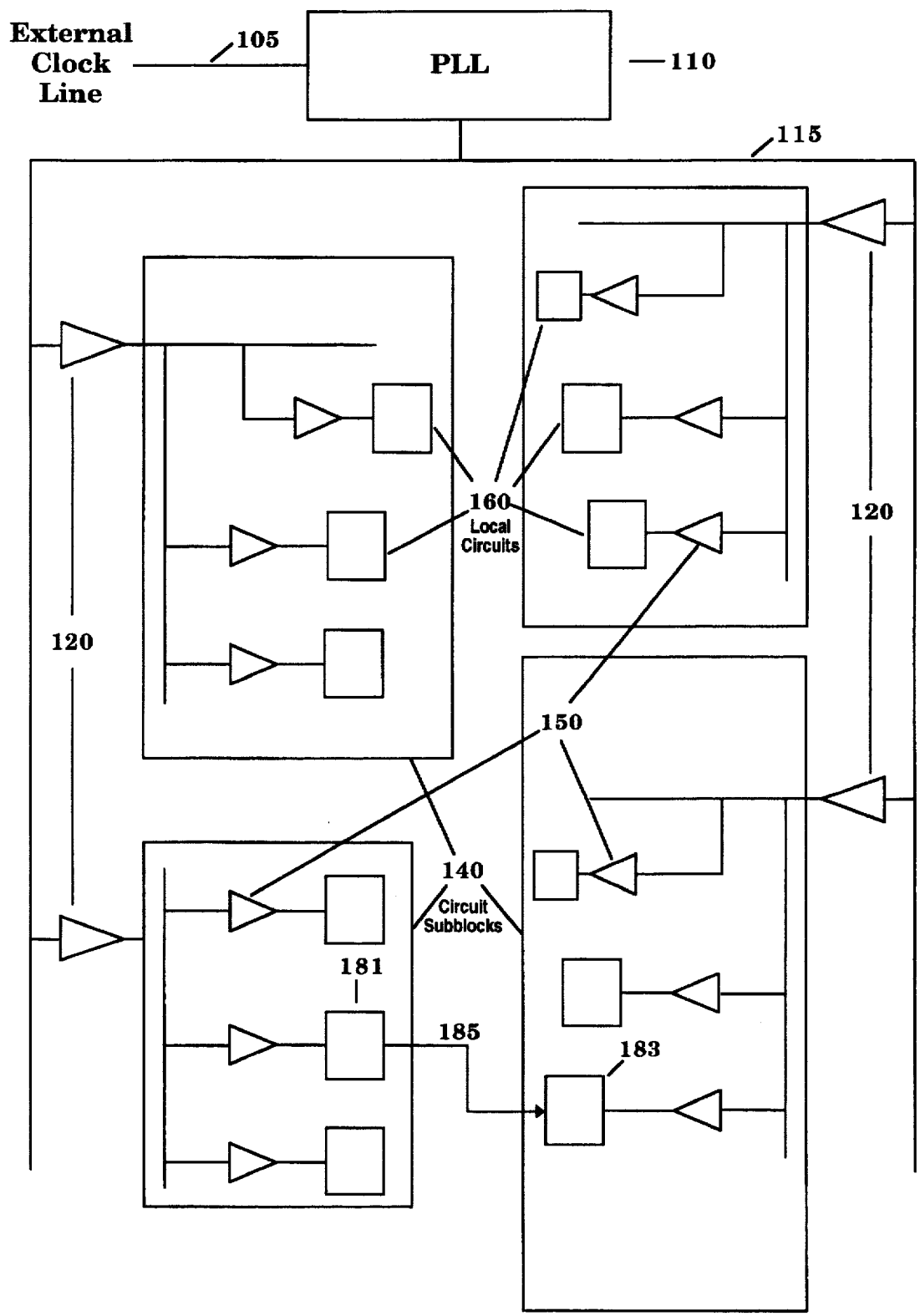
FIG. 1 illustrates a block diagram of a highly integrated digital integrated circuit.

FIG. 1 illustrates a block diagram of a typical clock distribution system for use within a digital integrated circuit. An external clock signal driven by a crystal or other means is introduced into the integrated circuit on line 105. The external clock line 105 enters a phase lock loop circuit 110 or other clock generator that drives a main clock signal 115 within the integrated circuit.

The digital integrated circuit of FIG. 1 is divided into several circuit subblocks 140. Each circuit subblock 140 provides some functionality for the integrated circuit. The main clock signal 115 is distributed to several subblock clock drivers 120 that drive the clock signal within the various circuit subblocks 140. The subblock clock drivers 120 strengthen the clock line signal in order to drive a large fan-out of local circuits within each circuit subblock. Within each circuit subblock, the strengthened clock line drives several local clock drivers 150. Each local clock driver 150 drives a local circuit 160.

Existing Local Clock Driver

Figure 2:
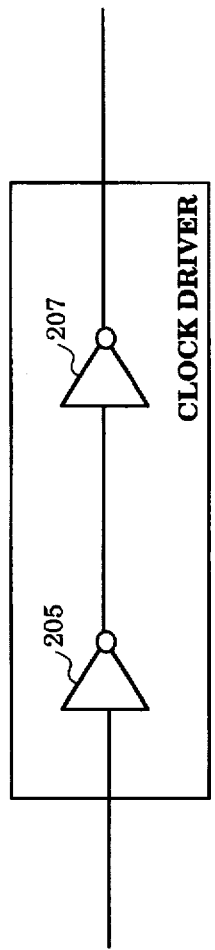
FIG. 2 illustrates a circuit diagram of a prior art clock driver.

As illustrated in FIG. 1, a complex digital integrated circuit has several clock drivers circuits such as clock driver circuits 120 and 150 that boost the clock signal within the digital integrated circuit. FIG. 2 illustrates a typical prior art clock driver circuit. The prior art clock driver signal circuit of FIG. 2 simply comprises two (or more) inverters in series. The inverters function to strengthen the clock signal. In a typical prior art clock distribution system, each of the clock drivers comprise the dual inverter clock driver illustrated in FIG. 2.

An Improved Local Clock Driver

Figure 3:
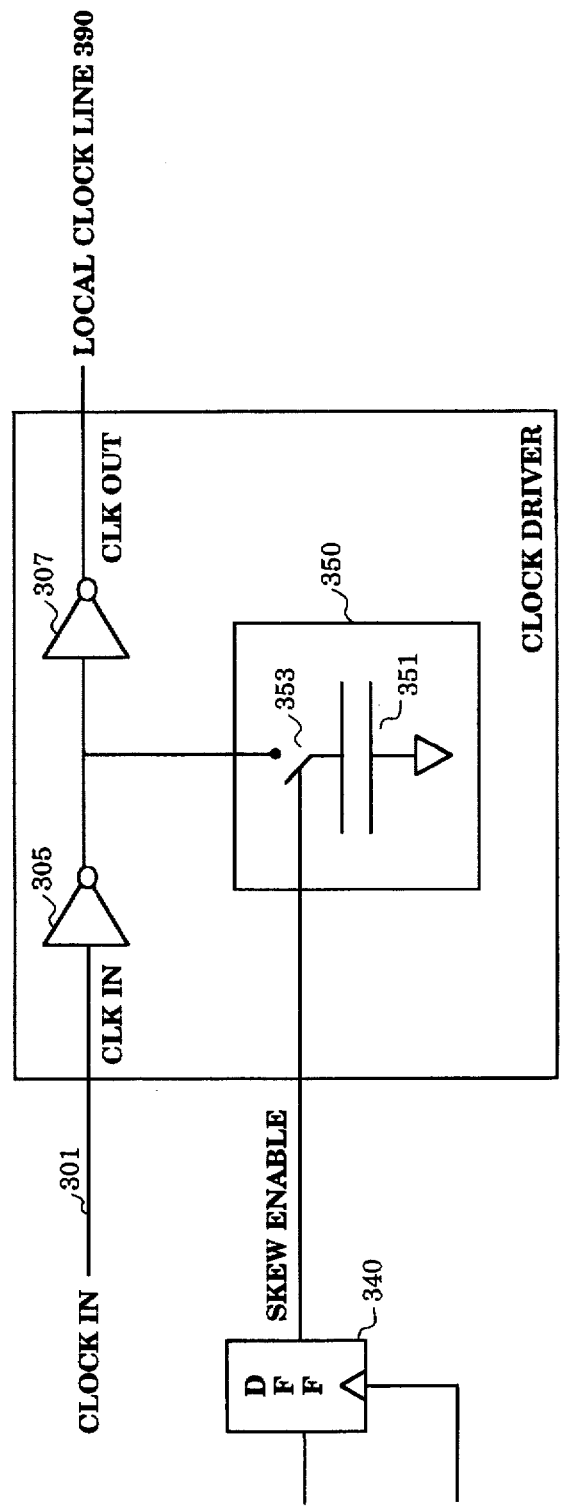
FIG. 3 illustrates a circuit diagram of the clock driver of the present invention.

The present invention comprises a method of introducing skew into various local clock signals such that speed paths can be detected. FIG. 3 illustrates one possible implementation of a local clock driver for use with the present invention. Like the prior art clock driver of FIG. 2, the clock driver of FIG. 3 comprises in part two (or more) inverters 305 and 307 that are in series. However, the clock driver of FIG. 3 also includes a delay circuit 350. The embodiment of FIG. 3 consists of delay circuit 350 comprising a switch 353 and a capacitor 351. Other types of know delay circuits can also be used. The switch 353 is controlled by a D flip flop 340.

The D flip flop 340 controls whether the skew enable is turned on or off. When the skew is disabled, the clock driver of FIG. 3 acts just like the clock driver of FIG. 2. When the skew is enabled, switch 353 is turned on such that the line between the two inverters 305 and 307 is connected through capacitor 351 to ground. When the line between inverter 305 and inverter 307 is connected through capacitor 351 to ground, additional time is required to build up charge before the signal is propagated by inverter 307. Thus, when the skew enable line is asserted, a delay will be added to the clock signal that passes through the clock driver circuit of FIG. 3.

Figure 4A:
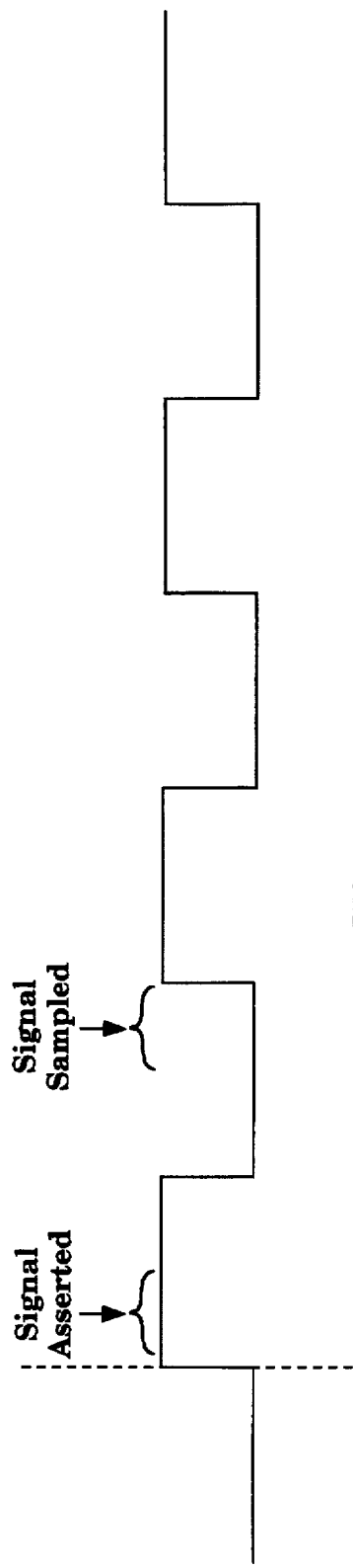
FIG. 4a illustrates a typical clock signal.

FIG. 4 illustrates a timing diagram for a typical clock line. The clock line of FIG. 4 is simply a square wave. Clock lines are used to synchronize the asserting of signals and sampling of signals within digital integrated circuits such as microprocessors. In the clock line illustrated in FIG. 4a data signals are asserted at the beginning of a clock cycle. The data signals are then propagated through the logic circuits. The data signals are then sampled at the end of the clock cycle by a receiving logic circuit.

Referring back to the clock driver of FIG. 3, when the skew enable for a local clock driver is enabled such that capacitor 351 is connected to the line between inverter 305 and inverter 307 a small delay will be introduced in the clock driver circuit. If all of the local clock drivers in a digital integrated are constructed according to the teachings of FIG. 3 then any single local clock circuit can be delayed by setting the D flip flop controlling the skew enable signal to one.

Figure 4B:
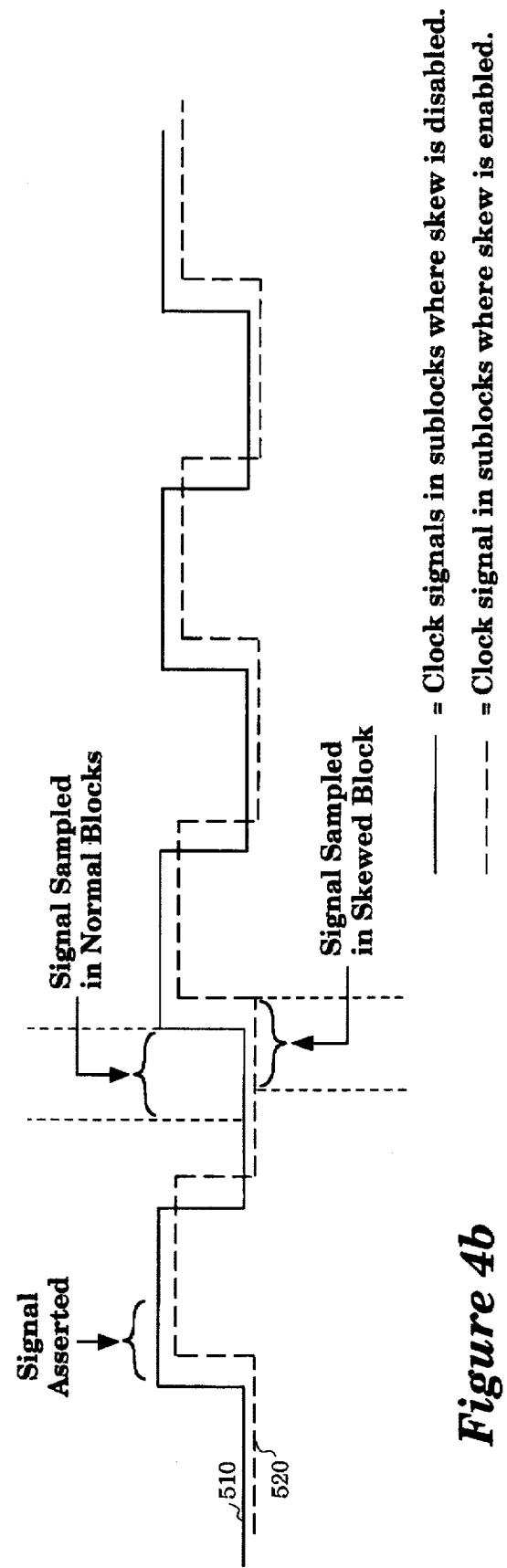
FIG. 4b illustrates a normal clock signal and a clock signal that has been delayed by the clock driver of the present invention.

FIG. 4b illustrates how one clock signal 520 appears when the clock signal 520 has the clock skew enabled and other clock signals 510 have the clock skew disabled. In all the subblocks where the skew is disabled, all the clock signals 510 are synchronized. However, in the single subblock 510 where the local clock driver has the skew enabled, the clock signal 520 will be shifted slightly to the right since it will be delayed. If a data signal originates in a subblock where the local clock driver skew is disabled and the data signal is transmitted to the subblock where the skew is enabled then there will be a lengthened period in which the data signal can be propagated since the signal will be sampled at a later time. This is clearly illustrated in FIG. 4b where the data signal sampling period for the subblock with the skew enabled has been shifted to the right since the clock signal has been delayed by the local clock driver.

Locating A Speed Path With The Improved Local Clock Driver

If every local clock driver in a digital integrated circuit contains the skew circuit of FIG. 3 then the critical "speed path" of the digital integrated circuit can easily be located. To locate the critical speed path the following steps are performed:

Step 1. Slowly increase the clock speed of the digital integrated circuit until the digital integrated circuit fails. This speed exceeds the limits of the critical speed path.

Step 2. Turn on the skew enable for one local clock driver in the digital integrated circuit and then test the digital integrated circuit.

Step 3. If the digital integrated circuit now functions properly, then you have located the receiving subblock of the critical speed path. Otherwise, turn on the skew enable for a different local clock driver in the digital integrated circuit and return to Step 2.

Step 4. Having identified the receiving subblock of the critical speed path, the source of the critical speed path must be found. Keeping the skew enable on for the receiving subblock, turn on the skew enable for another subblock that sends data signals to the receiving subblock.

Step 5. If the digital integrated circuit now malfunctions, then you have located the source subblock of the critical speed path. Otherwise, turn on the skew enable for a different source subblock local clock driver in the digital integrated circuit and return to Step 4 until the source subblock is found.

As specified in the steps above, a person debugging an integrated circuit with the improved local clock drivers must be able to turn the skew enable on and off for all the various local clock drivers. Thus, the digital integrated circuit must be designed such that the skew enable for the local clock drivers are independently addressable.

Figure 5:
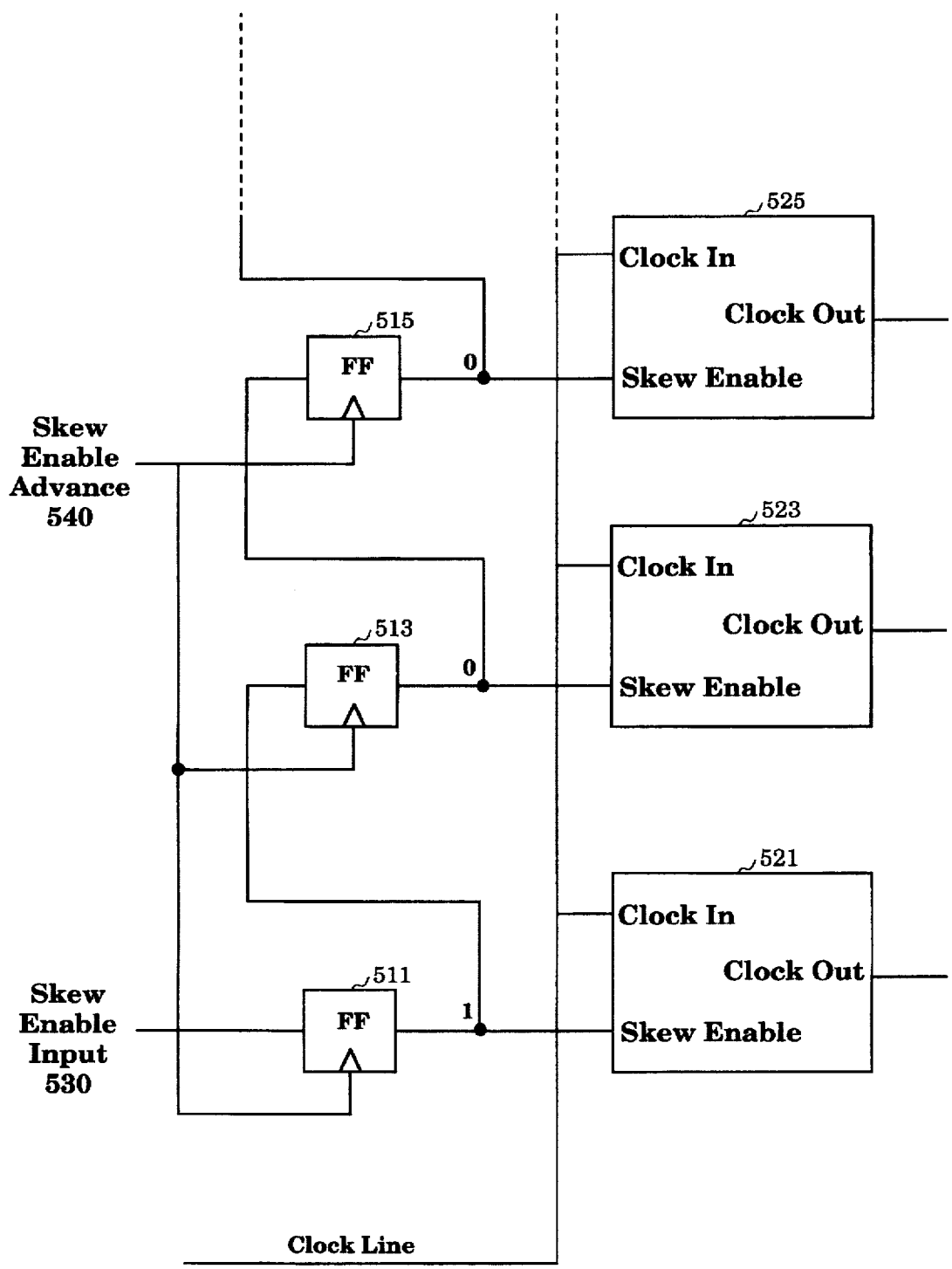
FIG. 5 illustrates a series of local clock drivers coupled to serially controlled flip-flops.

FIG. 5 illustrates one means of solving this problem. FIG. 5 illustrates a set of local clock drivers (521, 523, and 525) coupled to D Flip-Flops (511, 513, and 515 respectively) used to control the skew enable signal. In the circuit in FIG. 5, the data-in and data-out ports of the D Flip-Flops (511, 513, and 515) are connected together serially such that a single skew enable input 530 can be used to set all of the local clock drivers by shifting in data values. The shifting is controlled by Skew Enable Advance 540. A pin on the outside of the integrated circuit can be designated as the clock driver skew enable data input line 530 and a second pin can be designated as the Skew Enable Advance 540. To skew the local clock drivers as needed, the person debugging the integrated circuit simply shifts in the proper binary string that will enable the desired local clock drivers.

After locating the source subblock and receiving subblock of a speed path, the integrated circuit designers can examine the integrated circuit and circuit layout to determine if an improved circuit or circuit layout with remedy the speed path.

Improving A Speed Path With The Improved Local Clock Driver

The improved local clock driver can be used to give the integrated circuit a slight improvement. To improve the performance in digital integrated circuit that has a speed path, the designers first use the steps from the previous section to locate the speed path within the digital integrated circuit. After locating the speed path of the digital integrated circuit, the designers then load the flip-flops that control skew enable of each clock driver such that only the flip-flop that controls the skew enable for the destination subblock of the critical speed path is enabled. This will cause the destination subblock to wait a little more before sampling the data signal. Thus, the overall clock speed of the digital integrated circuit can be increased slightly.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A method of locating a critical speed path in an integrated circuit, said method comprising the steps of increasing a clock speed of the integrated circuit until the integrated circuit fails;

delaying a local clock signal in a circuit subblock; and testing said integrated circuit, if said integrated circuit functions properly then said circuit subblock is a destination subblock of said critical speed path, else delay a different local clock signal in a different circuit subblock and repeat said steps of delaying and testing until said integrated circuit functions properly.

2. The method of locating a critical speed path in an integrated circuit as claimed in claim 1 further comprising the steps of delaying said local clock signal in said destination subblock;

delaying a second local clock signal in a second circuit subblock; and testing said integrated circuit, if said integrated circuit fails then said second circuit subblock is a source subblock of said critical speed path, else delay a different local clock signal in a different second circuit subblock and repeat said steps of delaying and testing until said integrated circuit fails.

3. An integrated circuit, said integrated circuit comprising the elements of a plurality of circuit subblocks, said circuit subblocks comprising different logic circuits;

a plurality of data paths, said data paths connecting said plurality of circuit subblocks, said data paths introducing propagation delay;

a plurality of serially coupled local clock drivers, wherein a local clock driver is coupled to each of said plurality of circuit subblocks, said local clock driver generating a local clock signal for synchronizing transmission along said data paths, said local clock driver having a programmable delay enable that allows a delay to be selectively introduced in said local clock signal.

4. The integrated circuit as claimed in claim 3 wherein said programmable delay enable in each local clock driver toggles a switch coupled to a capacitor that is coupled to an electrical ground.

5. A clocking circuit, said clocking circuit comprising the elements of an advance input;

a plurality, of serially coupled clock driver circuits, wherein each clock driver circuit further comprises:
a driver circuit for generating a local clock signal;
a delay circuit coupled to said local clock signal, said delay circuit for delaying said local clock signal; and
a delay latch coupled to said delay circuit and said advance input, said delay latch for transmitting and latching delay signals along said serially coupled clock driver circuits; and a first input, said first input coupled to a first clock driver circuit of said serially coupled clock driver circuits.

6. The clock driver circuit as claimed in claim 5, wherein said delay circuit comprises a capacitor coupled to ground.

7. A method of improving a critical speed path in an integrated circuit, said method comprising the steps of:

increasing a clock speed of the integrated circuit until the integrated circuit fails;

delaying a local clock signal in a circuit subblock; and testing said integrated circuit, if said integrated circuit functions properly then said circuit subblock is said destination subblock of said critical speed path, else delaying a different local clock signal in a different circuit subblock and repeating said steps of delaying and testing until said integrated circuit functions properly; and selectively delaying a local clock driver in said destination circuit of said critical speed path.

8. The method of claim 7 wherein said step of selectively delaying a local clock driver in a destination circuit comprises adding capacitance to said local clock signal in said local clock driver.

* * * * *